United States Patent [19]

Sawaya

[11] Patent Number: 5,196,992
[45] Date of Patent: Mar. 23, 1993

[54] RESIN SEALING TYPE SEMICONDUCTOR DEVICE IN WHICH A VERY SMALL SEMICONDUCTOR CHIP IS SEALED IN PACKAGE WITH RESIN

[75] Inventor: Hiromichi Sawaya, Kawasaki, Japan

[73] Assignee: Kabushiki Kaisha Toshiba, Kawasaki, Japan

[21] Appl. No.: 803,783

[22] Filed: Dec. 6, 1991

Related U.S. Application Data

[63] Continuation of Ser. No. 570,537, Aug. 21, 1990, abandoned.

[30] Foreign Application Priority Data

Aug. 25, 1989 [JP] Japan .................................. 1-219404
Jun. 29, 1990 [JP] Japan .................................. 2-173065

[51] Int. Cl.⁵ ........................ H05K 5/02; H01L 23/02; H01L 23/28; H01L 23/48
[52] U.S. Cl. .................................... 361/392; 361/421; 357/72; 174/52.4
[58] Field of Search ................. 174/52.4; 361/392, 395, 361/399, 401, 421; 357/72

[56] References Cited

U.S. PATENT DOCUMENTS

| | | | |
|---|---|---|---|
| 3,617,817 | 11/1971 | Kawakatsu et al. | 357/72 |
| 4,677,528 | 6/1987 | Miniet | 361/399 |
| 4,780,572 | 10/1988 | Kondo et al. | 174/52.4 |
| 4,800,419 | 1/1989 | Long et al. | 357/72 X |
| 4,903,114 | 2/1990 | Aoki et al. | 357/70 |
| 5,030,796 | 7/1991 | Swanson et al. | 174/52.4 X |
| 5,083,189 | 1/1992 | Sawaya | 357/72 |

FOREIGN PATENT DOCUMENTS

| | | |
|---|---|---|
| 0247644 | 2/1987 | European Pat. Off. . |
| WO88/05962 | 8/1988 | European Pat. Off. . |
| 57-207357 | 12/1982 | Japan ............................ 357/74 |
| 58-122763 | 7/1983 | Japan ............................ 357/72 |

OTHER PUBLICATIONS

Japanese Patent Abstract, vol. 7, No. 214 (E-199) [3159], Sep. 21, 1983; Japanese Patent Document No. 58-107659, Jun. 27, 1983, Seikoo Keiyou Kogyo K.K.
Japanese Patent Abstract, vol. 10, No. 158 (E-409) [2214], Jun. 6, 1986; Japanese Patent Document No. 61-14731, Jan. 1, 1986, Kansai Nippon Denki K.K.

Primary Examiner—Leo P. Picard
Assistant Examiner—Michael W. Phillips
Attorney, Agent, or Firm—Finnegan, Henderson, Farabow, Garrett and Dunner

[57] ABSTRACT

A lead of a lead frame cannot be made close to a very small semiconductor chip in view of processing dimensions. If a TAB technique is used to directly connect the semiconductor chip and the lead in order to improve in reliability, a device for forming a bump on an electrode of the chip is required, which increases the cost of investment in equipment. A printed circuit board is formed between the lead and bed and a bonding wire is used to shorten the length of wiring and thus to decrease in cost and improve in reliability. Since an electrode pad of the semiconductor chip, the printed circuit board, and the lead are connected to each other using the TAB techique, the productivity of semiconductor device is increased. Using the TAB technique, no bumps are formed anywhere and the cost of investment in equipment is not so increased.

16 Claims, 5 Drawing Sheets

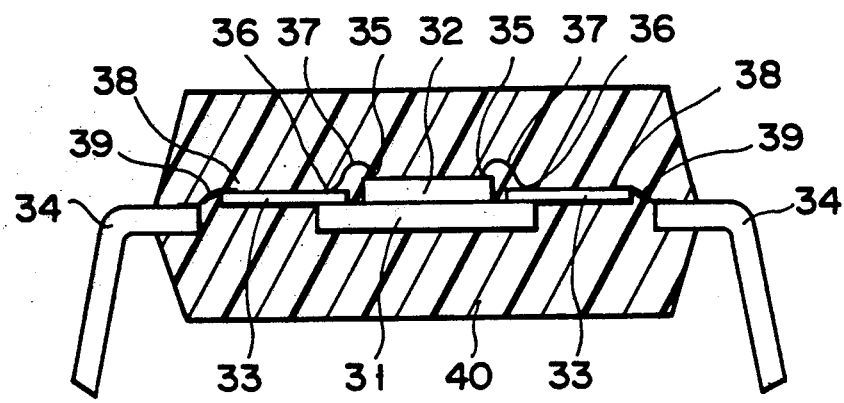
F I G. 3
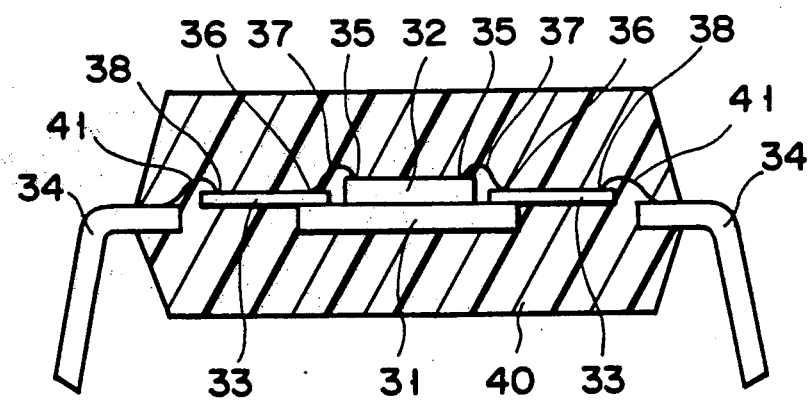
F I G. 4

RESIN SEALING TYPE SEMICONDUCTOR DEVICE IN WHICH A VERY SMALL SEMICONDUCTOR CHIP IS SEALED IN PACKAGE WITH RESIN

This application is a continuation of application Ser. No. 07/570,537, filed Aug. 21, 1990, abandoned.

BACKGROUND OF THE INVENTION

1. Field of the Invention

The present invention relates to a resin sealing type semiconductor device wherein a very small semiconductor chip is sealed in a package with resin.

2. Description of the Related Art

Semiconductor chips have been reduced in size in accordance with miniaturization of elements. Generally, as the size of a semiconductor chip decreases, the mechanical stress thereof lowers, and, thus the semiconductor chip is more difficult to break. The small semiconductor chip has a more reliable temperature a variation than a large one and it can be manufactured at low cost. Using small semiconductor chips, a semiconductor device whose operating speed is high, power consumption is low, and electrical characteristic are good, can be achieved.

FIG. 1 is a cross sectional view showing a semiconductor device in which a very small semiconductor chip having the above-described features is sealed with resin. Semiconductor chip 12 is die-bonded onto bed 11 of a lead frame, lead 13 of the lead frame is connected to electrode pad 14 on chip 12 by bonding wire 15 and they are sealed in with mold resin 16. Since the lead frame to be processed is limited in size, lead 13 cannot be arranged sufficiently close to semiconductor chip 12 and inevitably bonding wire 15 is lengthened.

Although bonding wire 15 is in a correct position before the semiconductor chip is sealed with resin, it is deformed by the pressure exerted during the resin sealing as indicated by broken line A in FIG. 1, and is brought into contact with another bonding wire. There is a strong possibility that bonding wire 15 becomes defective.

One method for solving the above problem, is to connect chip 12 and lead 13 by TAB (Tape Automated Bonding) tape 21 using a TAB technique, as shown in FIG. 2. The TAB technique is as follows. TAB tape 21 is formed by sticking electrode pad 14 and a thin-film wire made of Cu or the like corresponding to lead 13 on a resin film. The TAB tape allows electrode pad 14 and lead 13 to be bonded together.

TAB tape 21 resists the pressure exerted when the chip is sealed with resin and thus does not deform. Since electrode pad 14 and lead 13 can be bonded, the productivity of semiconductor devices is high. According to the TAB technique, however, a bump (projected electrode) 22 needs to be formed on electrode pad 14 so that the electrode pad does not contact the edge of the chip, and the chip is not damaged by the bonding operation, and a special device for forming the bump is required. For this reason, an equipment investment in manufacturing process increases the manufacturing cost and it is economically difficult to apply the TAB technique to the semiconductor device of the present invention whose price is low.

SUMMARY OF THE INVENTION

It is accordingly a first object of the present invention to provide a resin sealing type semiconductor device which prevents defects from being caused by deformation of a wire when a semiconductor chip is sealed in resin and which can thus be manufactured at relatively low cost. It is a second object of the present invention to provide a resin sealing type semiconductor device which suppresses an increase in cost of equipment investment in manufacturing process and whose manufacturing cost is relatively low, reliability is high and productivity is high.

To attain the first object of the present invention, there is provided a resin sealing type semiconductor device comprising:

a semiconductor chip having a plurality of electrodes;

a bed fixed to the semiconductor chip;

a printed circuit board which is fixed to a periphery of a surface and of the bed so as to overhang from the bed and on a surface of which a wiring pattern is formed;

a plurality of lead frames arranged so as to surround the bed;

first connecting means for connecting the electrodes arranged on the semiconductor chip and one end of the wiring pattern formed on the printed circuit board; and second connecting means for connecting the lead frames and the other end of the wiring pattern formed on the printed circuit board.

With the above structure of the semiconductor device, an interval between the bed and each of the leads can be supplemented with the printed circuit board which is fixed so as to overhang from the bed and on which the wiring pattern is formed. The distance between the electrode pads and the printed circuit board is thus shortened. Since the semiconductor chip and the leads are connected via the substrate, the reliability of the semiconductor device becomes high without adopting the TAB technique wherein bumps need to be formed on the chip when the chip and leads are directly connected to each other.

To attain the second object of the present invention, there is provided a resin sealing type semiconductor device comprising:

a semiconductor chip on the surface of which a plurality of electrodes is arranged;

a bed fixed to the semiconductor chip;

a printed circuit board which is fixed on the bed in the vicinity of the semiconductor chip and on which a wiring pattern is formed to be connected to the electrodes;

a plurality of lead frames arranged so as to surround the bed; and a wiring of a film carrier type connected to the wiring pattern on the printed circuit board and to the lead frames.

According to this structure of the present invention, no bumps need to be formed using the TAB technique in order to connect the printed circuit board and the leads. The manufacturing cost of semiconductor devices is not increased so greatly, which improves the productivity of the devices. If a printed circuit board is connected to leads using the TAB technique in a multichip package (MCP) semiconductor device, the reliability and productivity of the MCP semiconductor device are improved.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross sectional view of a resin sealing type semiconductor device according to a first embodiment of the present invention in which a very small semiconductor chip is sealed with resin;

FIG. 4 is a cross sectional view of a resin sealing type semiconductor device according to a second embodiment of the present invention in which the semiconductor chip as shown in FIG. 3 is sealed with resin;

DETAILED DESCRIPTION OF THE PREFERRED EMBODIMENTS

Figure 1:
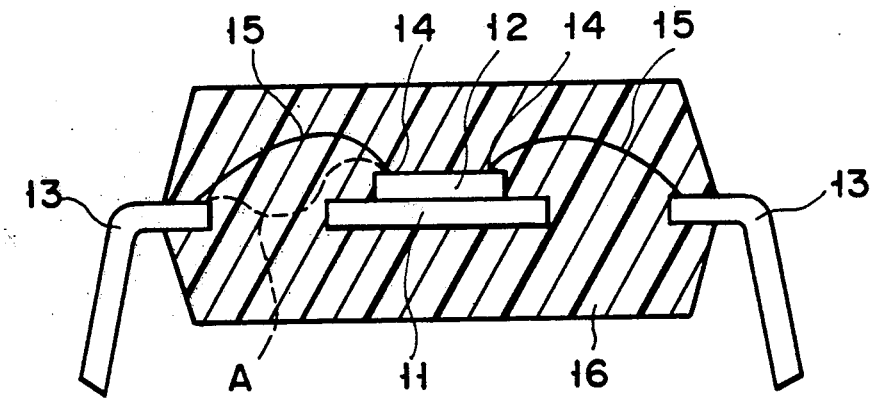
FIG. 1 is a cross sectional view of a conventional resin sealing type semiconductor device in which a very small semiconductor chip is sealed with resin.
Figure 2:
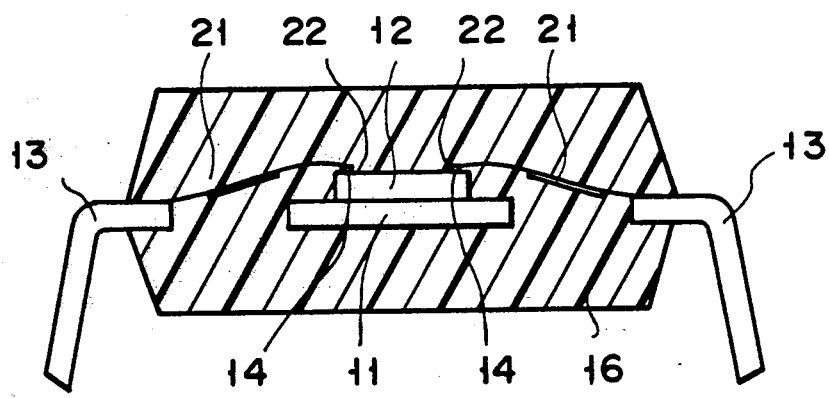
FIG. 2 is a cross sectional view of the conventional semiconductor device shown in FIG. 1 in which the semiconductor chip is connected to leads of lead frames using the TAB technique.

Embodiments of the present invention will be described with reference to accompanying drawings.

FIG. 3 is a cross-sectional view of the configuration of a resin sealing type semiconductor device according to the first embodiment of the present invention. Semiconductor chip 32 is die-bonded onto bed 31 of a lead frame by solder or conductive epoxy resin. Insulation wiring substrate 33 is fixed to an end portion on the surface of bed 31 so as to overhang from bed 31. A plurality of desired wiring patterns, not shown, are formed on printed circuit board 33, and printed circuit board 33 is used to connect lead 34 of the lead frame and semiconductor chip 32 which cannot be made close to each other because of processing dimensions. Each of a plurality of I/O electrode pads 35 formed on chip 32 is connected to connecting terminal 36 of substrate 33 by means of bonding wire 37, and lead 34 is connected to another connecting terminal 38 of substrate 33 by means of TAB tape 39. Semiconductor chip 32, including printed circuit board 33, is then covered with mold resin 40, and part of lead 34 is exposed outside as an outer lead.

According to the first embodiment, in a semiconductor device produced by sealing very small semiconductor chip 32 in a package with resin, the deformation of bonding wire 37 due to pressure applied when the sealing operation is performed, neither causes a short circuit nor affects the reliability of the semiconductor device since the bonding wire is short. Even if such a bonding wire is used, the yield can be improved. Since semiconductor chip 32 and printed circuit board 33 are connected by bonding wire 37, no special device is required to form bumps (projected electrodes) on I/O electrode pad 35 of chip 32. It is thus only an OLB (outer lead bonding) apparatus for connecting printed circuit board 33 and lead 34 by TAB tape 39 that is required new equipment. The investment in equipment in the manufacturing process can thus be reduced.

In the semiconductor device whose price is low and in which bumps are formed on electrode pad 35 and it is economically difficult to connect electrode 35 and lead 34 and by the TAB tape, if printed circuit board 33 is formed, the semiconductor device can be manufactured with high reliability and at low cost.

Furthermore, since the TAB technique is used to connect printed circuit board 33 and lead 34, the productivity of semiconductor devices can be enhanced. No bumps need to be formed and thus the manufacturing cost of the semiconductor devices is not increased.

Figure 5:
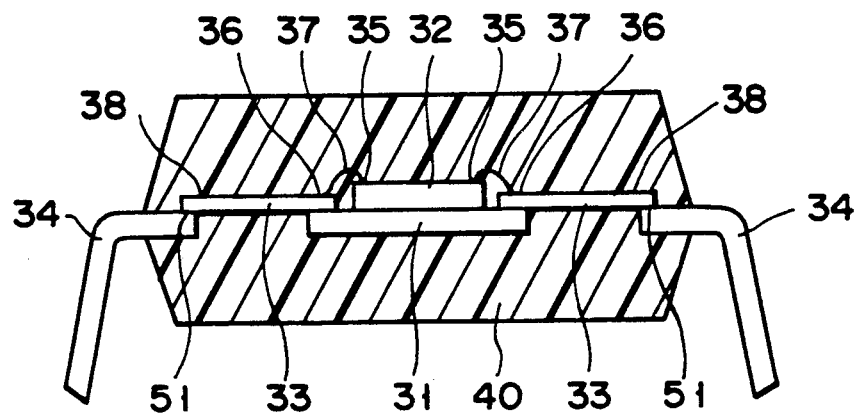
FIG. 5 is a cross sectional view of a resin sealing type semiconductor device according to a third embodiment of the present invention in which the semiconductor chip as shown in FIG. 3 is sealed with resin.
Figure 6:
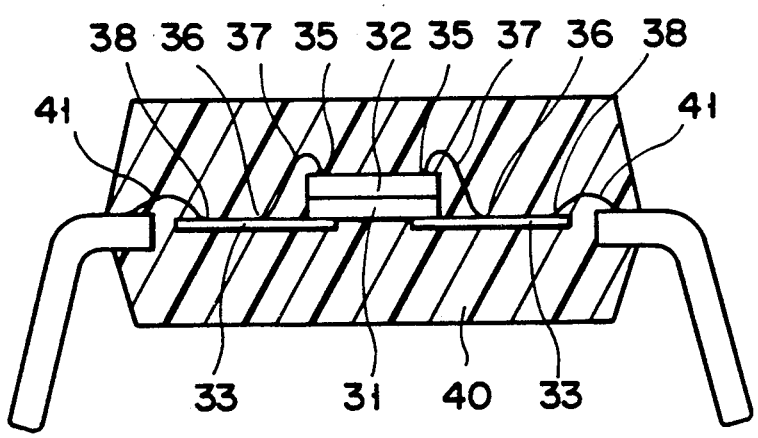
FIG. 6 is a cross sectional view of a resin sealing type semiconductor device according to a fourth embodiment of the present invention in which the semiconductor chip as shown in FIG. 3 is sealed with resin.

The methods of electrically connecting chip 32 and printed circuit board 33 and electrically connecting printed circuit board 33 and lead 34 are not limited to the first embodiment. For example, as shown in FIG. 4, printed circuit board 33 and lead 34 can be connected to each other by a bonding wire 41. As illustrated in FIG. 5, the electrical connection of printed circuit board 33 and lead 34 can be performed by a forming contact portion 51 on the undersurface of printed circuit board 33 using a wireless bonding technique. It is therefore necessary only to perform a bonding operation which is the most suitable for a semiconductor chip. If bed 31 is small and has no space for fixing printed circuit board 33, board 33 can be fixed onto the undersurface of bed 31, as shown in FIG. 6. Various applications can thus be made to the first embodiment.

Figure 7:
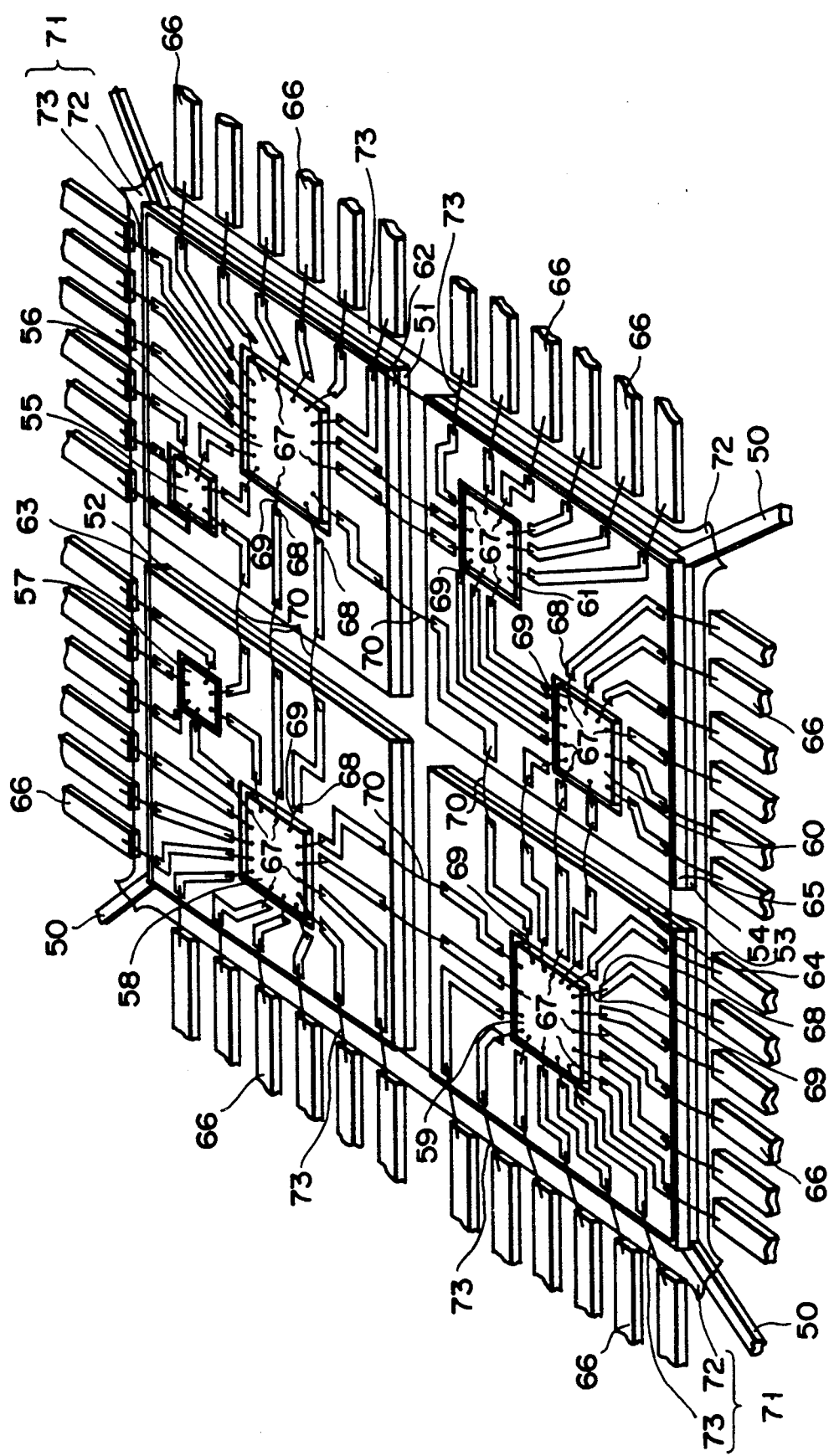
FIG. 7 is a perspective view of an MCP (multi chip package) to which the structure of the semiconductor chip shown in FIG. 3 is applied, according to a fifth embodiment of the present invention.

FIG. 7 illustrates an MCP (multi chip package) to which the semiconductor chip shown in FIG. 3 is applied.

As illustrated in FIG. 7, semiconductor chips 55–61 are properly arranged and die-bonded onto beds 51–54 of lead frames fixed by hanging pins 50. Printed circuit boards 62–65 are formed on beds 51–54 so as to surround the semiconductor chips. The printed circuit boards 62–65 overhand the beds 51–54 near the handing pins 50. A desired wiring pattern is formed on each of the printed circuit boards 62–65 and used to electrically connect lead 66 and each of chips 55–61, which cannot be made close to each other in view of processing dimensions, and to connect chips 55–61 to one another. A plurality of I/O electrode pads 67, formed on the surface of each of chips 55–61, is connected by bonding wires 69 to connecting terminals 68 of the wiring patterns, which are near the semiconductor chips. The connecting terminals of the wiring patterns, which are near the periphery of the one of printed circuit boards 62–65, are connected to the wiring patterns of other printed circuit boards and electrically connected to leads 66. The former connection is performed by bonding wires 70, and the latter connection is performed by TAB tapes 71 using the TAB technique. TAB tape 71 is obtained by forming lead line 73 plated with copper on polyamide film 72 so as to correspond to lead 66. The connecting terminals of each of the printed circuit boards 62–65 are connected to their corresponding leads 66 at the same time.

Figure 8:
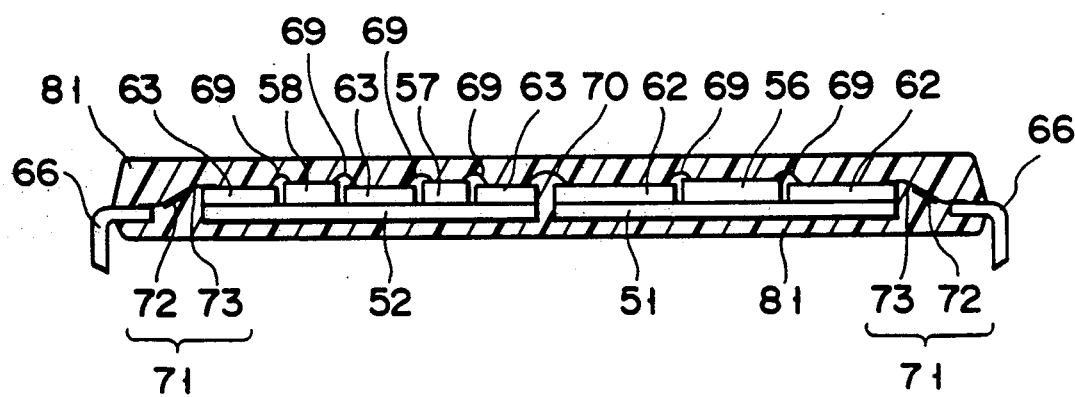
FIG. 8 is a cross sectional view of the MCP shown in FIG. 7 which is sealed with resin.

FIG. 8 is a cross sectional view of the MCP shown in FIG. 7 which is sealed with resin. In FIG. 8, the same elements as those in FIG. 7 are denoted by the same reference numerals. The printed circuit boards are connected to each other by bonding wires, and the semiconductor chips are connected to printed circuit boards by bonding wires. The printed circuit boards are connected to their corresponding leads 66 by TAB tapes 71. The MCP is thus sealed with mold resin 81. Like the structure shown in FIG. 3, no bumps need to be formed, so the manufacturing cost is not increased, and an MCP of a multi-pin structure having a large number of leads 66 is improved in reliability and productivity.

As described above, according to the present invention, a resin sealing type semiconductor device whose price is low and reliability is high can be provided, and an MCP can be improved in reliability and productivity.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A resin sealing type semiconductor device for sealing a semiconductor chip in a package with resin without deforming a plurality of electrical connections with the resin, comprising:
    a semiconductor chip having a plurality of electrodes arranged on a surface of the semiconductor chip;
    a bed having a surface supporting said semiconductor chip, said surface extending beyond said semiconductor chip, the portion of said surface extending beyond said semiconductor chip being a periphery surface;
    a plurality of leads apart from said bed;
    a printed circuit board provided to fill a gap between said bed and said leads, said printed circuit board fixed to said periphery surface of said bed so as to overhang from said bed, said printed circuit board having a wiring pattern having first and second ends;
    first connecting means for connecting the electrodes on said semiconductor chip to the first end of the wiring pattern on the surface of said printed circuit board; and
    second connecting means for connecting said leads to the second end of the wiring pattern on the surface of said printed circuit board,
    wherein said device is covered with mold resin with parts of said leads left uncovered.

2. A resin sealing type semiconductor device according to claim 1, wherein said first connecting means is a bonding wire.

3. A resin sealing type semiconductor device according to claim 1, wherein said second connecting means is a bonding wire.

4. A resin sealing type semiconductor device according to claim 1, wherein said second connecting means directly connects the leads to the second end of the wiring pattern of said printed circuit board.

5. A resin sealing type semiconductor device according to claim 1, wherein said second connecting means is of a film carrier type in which a lead is stuck on a film.

6. A resin sealing type semiconductor device according to claim 1, wherein said first and second connecting means are bonding wires.

7. A resin sealing type semiconductor device according to claim 1, wherein said first connecting means is a bonding wire and said second connecting means is of a film carrier type in which a lead is stuck on a film.

8. A resin sealing type semiconductor device for sealing a semiconductor chip in a package with resin without deforming a plurality of electrical connections with the resin, comprising:
    a semiconductor chip having a plurality of electrodes arranged on a surface of said semiconductor chip;
    a bed having a surface supporting said semiconductor chip, said surface extending beyond said semiconductor chip, the portion of said surface extending beyond said semiconductor chip being a periphery surface;
    a plurality of leads apart form said bed;
    a printed circuit board provided to fill a gap between said bed and said leads, said printed circuit board being fixed to said periphery surface of said bed so as to overhang from said bed, said printed circuit board having a wiring pattern connected to said electrodes; an
    wiring of a film carrier type for connecting the wiring pattern on said printed circuit board and said leads,
    wherein said device is covered with mold resin with parts of said leads left uncovered.

9. A resin sealing type semiconductor device according to claim 8, wherein said printed circuit board and the electrodes of said semiconductor chip are connected to each other by a bonding wire.

10. A resin sealing type semiconductor device for sealing a semiconductor chip in a package with resin without deforming a plurality of electrical connections with the resin, comprising:
    a plurality of semiconductor chips, each of said semiconductor chips having a plurality of electrodes arranged on a surface of said semiconductor chip;
    a plurality of beds separated from each other, each bed having a surface supporting at least one semiconductor chip, said surface extending beyond said at least one semiconductor chip, the portion of said surface extending beyond said at least one semiconductor chip being a periphery surface;
    a plurality of leads apart from said beds;
    a printed circuit board fixed to each periphery surface of said beds, at least one of said printed circuits boards overhanging the corresponding one of said beds, each of said printed circuit boards having a wiring pattern connected to said electrodes; and
    wiring of a film carrier type for connecting the wiring patterns on said printed circuit boards and said leads,
    wherein said device is covered with mold resin with parts of said leads left uncovered.

11. A resin sealing type semiconductor device according to claim 10, wherein at least one of said plurality of semiconductor chips is formed on each of said beds.

12. A resin sealing type semiconductor device according to claim 10 wherein the wiring patterns on said printed circuit boards are connected to the electrodes of said semiconductor chips by bonding wires.

13. A resin sealing type semiconductor device according to claim 10, wherein said wiring is formed by connecting the wiring pattern on said printed circuit boards and said leads by a lead stuck on a film.

14. A resin sealing type semiconductor device according to claim 10, wherein said printed circuit boards have the same contours as said beds which are fixed to said printed circuit boards.

15. A resin sealing type semiconductor device according to claim 10, wherein said printed circuit boards have the same contours as said beds which are fixed to said printed circuit boards and have connecting means for electrically connecting said printed circuit boards.

16. A resin sealing type semiconductor device according to claim 15, wherein said connecting means of said printed circuit boards are bonding wires.

* * * * *

UNITED STATES PATENT AND TRADEMARK OFFICE
CERTIFICATE OF CORRECTION

PATENT NO. : 5,196,992
DATED : March 23, 1993
INVENTOR(S) : Hiromichi Sawaya

It is certified that error appears in the above-indentified patent and that said Letters Patent is hereby corrected as shown below:

Abstract, line 14, change "device" to --devices--.

Claim 8, column 6, line 25, change "an" to --and--.

Signed and Sealed this

First Day of March, 1994

*Attest:*

BRUCE LEHMAN

*Attesting Officer*  *Commissioner of Patents and Trademarks*